US011262655B2

(12) United States Patent
Maruyama et al.

(10) Patent No.: US 11,262,655 B2
(45) Date of Patent: Mar. 1, 2022

(54) PHOTOSENSITIVE RESIN COMPOSITION, PHOTOSENSITIVE DRY FILM, AND PATTERN FORMING PROCESS

(71) Applicant: Shin-Etsu Chemical Co., Ltd., Tokyo (JP)

(72) Inventors: Hitoshi Maruyama, Annaka (JP); Hideto Kato, Annaka (JP); Michihiro Sugo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 284 days.

(21) Appl. No.: 16/411,472

(22) Filed: May 14, 2019

(65) Prior Publication Data
US 2019/0354014 A1 Nov. 21, 2019

(30) Foreign Application Priority Data

May 17, 2018 (JP) .............................. JP2018-095370

(51) Int. Cl.
| C08G 77/60 | (2006.01) |
| G03F 7/075 | (2006.01) |
| G03F 7/004 | (2006.01) |
| G03F 7/038 | (2006.01) |
| G03F 7/40 | (2006.01) |
| H01L 23/00 | (2006.01) |
| C08G 77/00 | (2006.01) |
| G03F 7/16 | (2006.01) |
| G03F 7/20 | (2006.01) |
| G03F 7/32 | (2006.01) |
| G03F 7/38 | (2006.01) |

(52) U.S. Cl.
CPC ........... *G03F 7/0757* (2013.01); *C08G 77/60* (2013.01); *G03F 7/0045* (2013.01); *G03F 7/0382* (2013.01); *G03F 7/40* (2013.01); *H01L 24/11* (2013.01); *H01L 24/13* (2013.01); C08G 77/70 (2013.01); C08G 77/80 (2013.01); G03F 7/168 (2013.01); G03F 7/2004 (2013.01); G03F 7/325 (2013.01); G03F 7/38 (2013.01); H01L 2224/11462 (2013.01); H01L 2224/11618 (2013.01); H01L 2224/13147 (2013.01)

(58) Field of Classification Search
None
See application file for complete search history.

(56) References Cited

U.S. PATENT DOCUMENTS

| 4,470,831 A | 9/1984 | Hirose |
| 4,990,546 A | 2/1991 | Eckberg |
| 5,240,971 A | 8/1993 | Eckberg et al. |
| 5,346,980 A | 9/1994 | Babu |
| 5,750,589 A | 5/1998 | Zech et al. |
| 6,072,016 A | 6/2000 | Kobayashi et al. |
| 6,590,010 B2 | 7/2003 | Kato et al. |
| 7,785,766 B2 | 8/2010 | Kato et al. |
| 8,697,333 B2* | 4/2014 | Soga ..................... G03F 7/0045 430/270.1 |
| 8,715,905 B2 | 5/2014 | Tagami et al. |
| 8,729,148 B2* | 5/2014 | Asai ..................... H01L 23/293 522/148 |
| 8,796,410 B2 | 8/2014 | Sugo et al. |
| 8,889,810 B2* | 11/2014 | Takeda ..................... C08G 77/52 528/26 |
| 9,012,111 B2* | 4/2015 | Asai ....................... G03F 7/0041 430/18 |
| 9,091,919 B2 | 7/2015 | Urano et al. |
| 9,122,158 B2* | 9/2015 | Asai ......................... G03F 7/038 |
| 10,503,067 B2 | 12/2019 | Maruyama et al. |
| 10,982,053 B2* | 4/2021 | Maruyama ............. G03F 7/0757 |
| 2008/0182087 A1* | 7/2008 | Kato .................. H01L 21/02126 428/195.1 |
| 2009/0156753 A1 | 6/2009 | Sugo et al. |
| 2011/0061914 A1 | 3/2011 | Sekito |
| 2011/0076465 A1* | 3/2011 | Takeda ..................... C08L 83/06 428/195.1 |
| 2011/0077364 A1 | 3/2011 | Tazaki et al. |
| 2011/0275768 A1* | 11/2011 | Yasuda .................. C09D 183/14 525/474 |
| 2012/0108762 A1* | 5/2012 | Kondo ................. H01L 21/6836 525/476 |
| 2012/0235284 A1* | 9/2012 | Sugo ..................... C09D 183/14 257/620 |
| 2013/0029145 A1* | 1/2013 | Kato ....................... C09J 183/04 428/354 |

(Continued)

FOREIGN PATENT DOCUMENTS

| EP | 0927736 A1 | 7/1999 |
| EP | 1186624 B1 | 3/2003 |

(Continued)

OTHER PUBLICATIONS

Search Report dated Dec. 19, 2018, issued in counterpart EP Application No. 18187705.1 (9 pages).
Extended European Search Report dated Sep. 20, 2019, issued in counterpart EP application No. 19172966.4. (8 pages).
Non-Final Office Action dated Aug. 24, 2020, issued in U.S. Appl. No. 16/414,281 (16 pages).
Non-Final Office Action dated Sep. 18, 2020, issued in U.S. Appl. No. 16/056,711 (14 pages).

(Continued)

*Primary Examiner* — Robert S Loewe
(74) *Attorney, Agent, or Firm* — Westerman, Hattori, Daniels & Adrian, LLP

(57) ABSTRACT

A photosensitive resin composition comprising (A) a silphenylene and polyether structure—containing polymer and (B) a photoacid generator is coated onto a substrate to form a photosensitive resin coating which has improved substrate adhesion, a pattern forming ability, crack resistance, and reliability as protective film.

12 Claims, No Drawings

(56) References Cited

U.S. PATENT DOCUMENTS

| | | |
|---|---|---|
| 2013/0108866 A1 | 5/2013 | Kato et al. |
| 2013/0108876 A1 | 5/2013 | Komori et al. |
| 2013/0135763 A1 | 5/2013 | Liao et al. |
| 2013/0149645 A1 | 6/2013 | Takemura et al. |
| 2013/0196114 A1 | 8/2013 | Urano et al. |
| 2013/0302983 A1 | 11/2013 | Tanabe et al. |
| 2013/0323631 A1 | 12/2013 | Asai et al. |
| 2016/0033865 A1 | 2/2016 | Takemura et al. |
| 2016/0097973 A1 | 4/2016 | Urano et al. |
| 2016/0315025 A1* | 10/2016 | Kondo .................... C08K 3/36 |
| 2017/0198102 A1* | 7/2017 | Yanaizumi ............. C08G 77/14 |
| 2017/0255097 A1 | 9/2017 | Takemura et al. |
| 2018/0004088 A1 | 1/2018 | Maruyama et al. |
| 2018/0224743 A1 | 8/2018 | Maruyama et al. |
| 2019/0049844 A1 | 2/2019 | Maruyama et al. |
| 2019/0354014 A1 | 11/2019 | Maruyama et al. |
| 2020/0165364 A1* | 5/2020 | Higuchi .................. B32B 27/16 |
| 2020/0165394 A1 | 5/2020 | Maruyama et al. |
| 2020/0201182 A1 | 6/2020 | Hirano et al. |

FOREIGN PATENT DOCUMENTS

| | | |
|---|---|---|
| EP | 1953183 A2 | 8/2008 |
| EP | 1953183 A3 | 11/2008 |
| EP | 2447304 A1 | 5/2012 |
| EP | 2587530 A2 | 5/2013 |
| EP | 1953183 B1 | 9/2013 |
| EP | 2397508 B1 | 2/2016 |
| EP | 3103835 A1 | 12/2016 |
| EP | 3211661 A2 | 8/2017 |
| EP | 3 214 497 A1 | 9/2017 |
| EP | 3 358 412 A1 | 8/2018 |
| JP | 8-32763 B2 | 3/1996 |
| JP | H11-80362 A | 3/1999 |
| JP | 2002-88158 A | 3/2002 |
| JP | 2008-184571 A | 8/2008 |
| JP | 2012-1668 A | 1/2012 |
| JP | 2012-092268 A | 5/2012 |
| JP | 2013-110391 A | 6/2013 |
| JP | 2013-173920 A | 9/2013 |
| JP | 2014-122276 A | 7/2014 |
| JP | 2016-74874 A | 5/2016 |
| JP | 2016-125032 A | 7/2016 |
| JP | 2018-002848 A | 1/2018 |
| JP | 2018-124552 A | 8/2018 |
| WO | 2016/076205 A1 | 5/2016 |

OTHER PUBLICATIONS

Li et a. "Synthesis and Properties of Polymers Containing Siphenylene Moiety via Catalytic Cross-Dehydrocoupling Polymerization of 1,4-Bis(dimethylsilyl)benzene" Macromolecules, 1999, 32, 8768-8773. (Year: 1999) (6 pages).

Office Action dated Sep. 1, 2020, issued in JP Application No. 2017-153884 (counterpart to U.S. Appl. No. 16/056,711), with English translation. (18 pages).

Extended European Search Report dated Dec. 20, 2018, issued in EP Application No. 18187713.5 (counterpart to U.S. Appl. No. 16/056,629). (7 pages).

Non-Final Office Action dated Sep. 18, 2020, issued in U.S. Appl. No. 16/056,629. (16 pages).

Non-Final Office Action dated May 22, 2019, issued in U.S. Appl. No. 15/883,265. (9 pages).

Notice of Reasons for Refusal dated Aug. 25, 2020, issued in JP Application No. 2017-153901 (counterpart to U.S. Appl. No. 16/056,629), with English translation. (8 pages).

Non-Final Office Action dated Jun. 10, 2021, issued in U.S. Appl. No. 16/676,591. (18 pages).

Non-Final Office Action dated Jun. 24, 2021, issued in U.S. Appl. No. 16/716,821. (17 pages).

Non-Final Action dated Sep. 14, 2021, issued in U.S. Appl. No. 16/056,629 (12 pages).

Non-Final Office Action dated Dec. 21, 2021, issued in U.S. Appl. No. 16/056,711. (11 pages).

* cited by examiner

PHOTOSENSITIVE RESIN COMPOSITION, PHOTOSENSITIVE DRY FILM, AND PATTERN FORMING PROCESS

CROSS-REFERENCE TO RELATED APPLICATION

This non-provisional application claims priority under 35 U.S.C. § 119(a) on Patent Application No. 2018-095370 filed in Japan on May 17, 2018, the entire contents of which are hereby incorporated by reference.

TECHNICAL FIELD

This invention relates to a photosensitive resin composition, a photosensitive dry film, and a pattern forming process.

BACKGROUND ART

In the prior art, photosensitive protective films for semiconductor devices and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 2 proposes a photosensitive silicone composition based on a silphenylene structure-containing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in reliability is desired.

CITATION LIST

Patent Document 1: JP-A 2002-088158 (USP 6,590,010, EP 1186624)
Patent Document 2: JP-A 2008-184571 (USP 7,785,766, EP 1953183)

DISCLOSURE OF INVENTION

An object of the invention is to provide a photosensitive resin composition and a photosensitive dry film, which give a cured resin coating or resin layer that can be processed in thick film form to define a fine size pattern, has improved film properties including crack resistance and adhesion to substrates for use in electronic parts and semiconductor devices and supports for use in circuit boards, and is thus reliable as a protective film for electric and electronic parts. Another object is to provide a pattern forming process using the foregoing.

The inventors have found that a silphenylene and polyether structure-containing polymer having crosslinking groups or crosslinking reaction-susceptible reactive sites in the molecule functions to provide a sufficient film-forming ability; that a composition comprising the polymer is used to form a photosensitive resin coating having a wide range of thickness; and that the photosensitive resin coating has improved adhesion to substrates, electronic parts and semiconductor devices, a pattern forming ability, crack resistance, electric insulation, and reliability as insulating protective film, and is thus useful as a protective film for electric and electronic parts and a resist material for plating.

In one aspect, the invention provides a photosensitive resin composition comprising (A) a silphenylene and polyether structure-containing polymer comprising repeating units having the following formulae (1) to (4), and (B) a photoacid generator

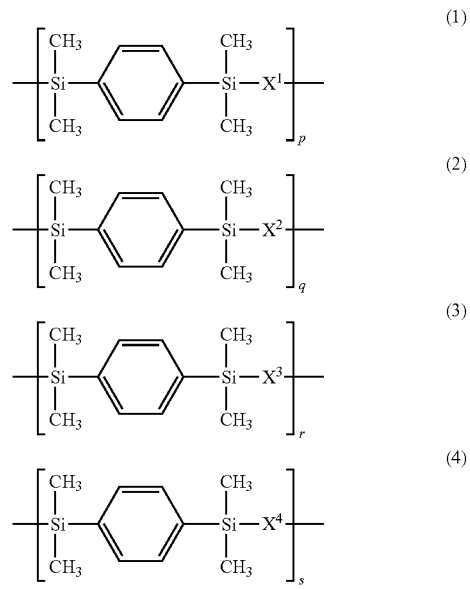

Herein $X^1$ is a divalent group having the following formula (X1), $X^2$ is a divalent group having the following formula (X2), $X^3$ is a divalent group having the following formula (X3), $X^4$ is a divalent group having the following formula (X4), and p, q, r and s are numbers in the range: $0 < p < 1$, $0 \leq q < 1$, $0 \leq r < 1$, $0 \leq s < 1$, $0 < q+r+s < 1$, and $p+q+r+s=1$.

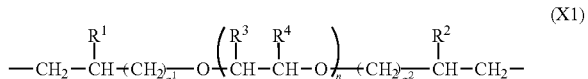

Herein $R^1$ and $R^2$ are each independently hydrogen or a $C_1$-$C_8$ monovalent hydrocarbon group, $R^3$ and $R^4$ are each independently hydrogen or methyl, $a^1$ and $a^2$ are each independently an integer of 1 to 6, and n is an integer of 0 to 100.

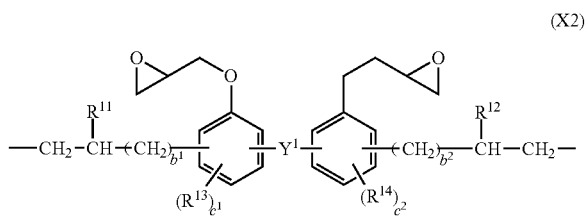

Herein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $b^1$ and $b^2$ are each independently an integer of 0 to 7, and $c^1$ and $c^2$ are each independently an integer of 0 to 2.

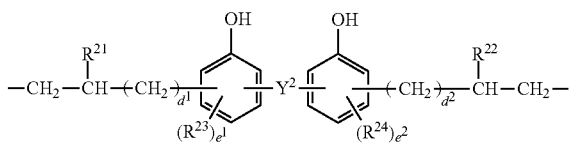
(X3)

Herein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $d^1$ and $d^2$ are each independently an integer of 0 to 7, and $e^1$ and $e^2$ are each independently an integer of 0 to 2.

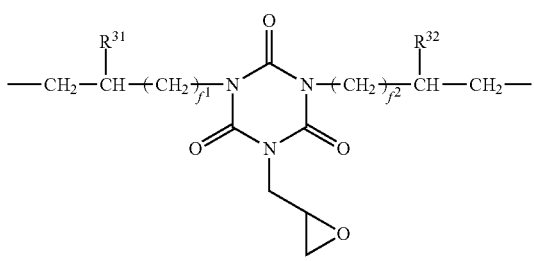
(X4)

Herein $R^{31}$ and $R^{32}$ are each independently hydrogen or methyl, and $f^1$ and $f^2$ are each independently an integer of 0 to 7.

The photosensitive resin composition may further comprise (C) a crosslinker, (D) a solvent and/or (E) a quencher. The crosslinker is typically at least one compound selected from the group consisting of an amino condensate modified with formaldehyde or formaldehyde-alcohol, a phenol compound having on the average at least two methylol or alkoxymethyl groups in the molecule, and an epoxy compound having on the average at least two epoxy groups in the molecule.

Typically, the photosensitive resin composition is to form a coating for protecting electric and electronic parts, or is used as a resist material in the step of forming copper interconnects by plating.

In another aspect, the invention provides a photosensitive resin coating obtained from the photosensitive resin composition defined above.

In a further aspect, the invention provides a photosensitive dry film comprising a support and the photosensitive resin coating thereon.

In a still further aspect, the invention provides a pattern forming process comprising the steps of (i) coating the photosensitive resin composition defined above onto a substrate to form a photosensitive resin coating thereon, (ii) exposing the photosensitive resin coating to radiation to define exposed and unexposed regions, and (iii) developing the exposed resin coating in a developer to dissolve away the unexposed region of the resin coating and to form a pattern of the resin coating.

In a still further aspect, the invention provides a pattern forming process comprising the steps of (i') using the photosensitive dry film defined above to form the photosensitive resin coating on a substrate, (ii) exposing the photosensitive resin coating to radiation to define exposed and unexposed regions, and (iii) developing the exposed resin coating in a developer to dissolve away the unexposed region of the resin coating and to form a pattern of the resin coating.

In either embodiment, the pattern forming process may further include the step of (iv) post-curing the patterned resin coating resulting from development step (iii) at a temperature of 100 to 250° C.

ADVANTAGEOUS EFFECTS OF INVENTION

The photosensitive resin composition and the photosensitive dry film have many advantages of photosensitive material and can be readily processed in thick film form to define a fine size pattern. The cured resin coating obtained from the photosensitive resin composition has improved film properties including chemical resistance against photoresist strippers and plating baths, adhesion to substrates, electronic parts, semiconductor devices, and supports for circuit boards, mechanical properties, and electric insulation, and is thus fully reliable as an insulating protective film. The cured resin coating also has crack resistance and is thus useful as a protective film-forming material for electric and electronic parts (such as circuit boards, semiconductor devices and display units) and a resist material for plating.

DESCRIPTION OF PREFERRED EMBODIMENT

As used herein, the notation (Cn-Cm) means a group containing from n to m carbon atoms per group.
Photosensitive Resin Composition One embodiment of the invention is a photosensitive resin composition comprising (A) a silphenylene and polyether structure-containing polymer, and (B) a photoacid generator.
(A) Silphenylene and Polyether Structure-Containing Polymer Component (A) is a polymer containing a silphenylene structure and a polyether structure, specifically comprising repeating units having the following formulae (1) to (4). For simplicity sake, this polymer is referred to as Polymer A, and the repeating units having the formulae (1) to (4) are referred to as repeating units (1) to (4), respectively. Polymer A has crosslinking groups such as epoxy and hydroxyl groups or crosslinking reaction-susceptible reactive sites in the molecule.

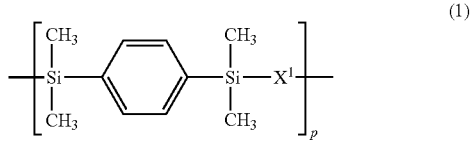
(1)

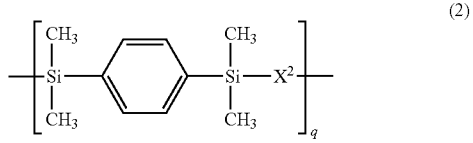
(2)

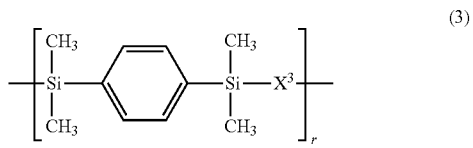
(3)

(4)

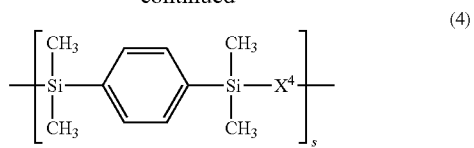

In formula (1), $X^1$ is a divalent group having the formula (X1).

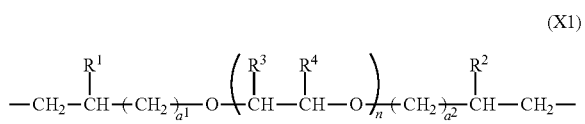

(X1)

In formula (X1), $R^1$ and $R^2$ are each independently hydrogen or a $C_1$-$C_8$ monovalent hydrocarbon group, $R^3$ and $R^4$ are each independently hydrogen or methyl, $a^1$ and $a^2$ are each independently an integer of 1 to 6, preferably 1 to 4, and more preferably 1 or 2, and n is an integer of 0 to 100, preferably 1 to 50, and more preferably 5 to 30.

The $C_1$-$C_8$ monovalent hydrocarbon groups may be straight, branched or cyclic, and include, for example, monovalent aliphatic hydrocarbon groups such as $C_1$-$C_8$ alkyl groups and $C_2$-$C_8$ alkenyl groups and monovalent aromatic hydrocarbon groups such as $C_6$-$C_8$ aryl groups and $C_7$ or $C_8$ aralkyl groups.

Examples of the $C_1$-$C_8$ alkyl group include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, and n-octyl. Examples of the alkenyl group include vinyl, propenyl, butenyl, and pentenyl. Examples of the aryl group include phenyl, 2-methylphenyl, 3-methylphenyl, 4-methylphenyl, 2-ethylphenyl, 3-ethylphenyl, 4-ethylphenyl, and dimethylphenyl. Examples of the aralkyl group include benzyl and phenethyl.

$R^1$ and $R^2$ are preferably hydrogen or $C_1$-$C_8$ alkyl groups, more preferably hydrogen or methyl.

In formula (X1), the alkylene oxide units with subscript n may be randomly or alternately arranged, or plural blocks of the same alkylene oxide units may be included.

In formula (2), $X^2$ is a divalent group having the formula (X2).

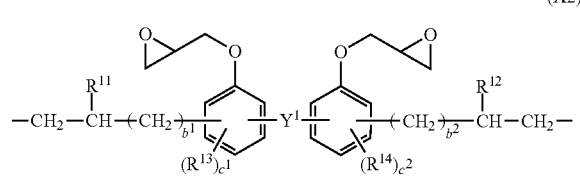

(X2)

In formula (X2), $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $b^1$ and $b^2$ are each independently an integer of 0 to 7, and $c^1$ and $c^2$ are each independently an integer of 0 to 2.

The $C_1$-$C_4$ alkyl group may be straight, branched or cyclic, and examples thereof include methyl, ethyl, n-propyl, isopropyl, cyclopropyl, n-butyl, isobutyl, sec-butyl, tert-butyl, and cyclobutyl. The $C_1$-$C_4$ alkoxy group may be straight, branched or cyclic, and examples thereof include methoxy, ethoxy, n-propyloxy, isopropyloxy, cyclopropyloxy, n-butyloxy, isobutyloxy, sec-butyloxy, tert-butyloxy, and cyclobutyloxy.

In formula (3), $X^3$ is a divalent group having the formula (X3).

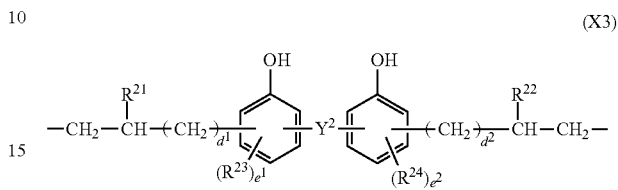

(X3)

In formula (X3), $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $d^1$ and $d^2$ are each independently an integer of 0 to 7, and $e^1$ and $e^2$ are each independently an integer of 0, 1 or 2. Examples of the $C_1$-$C_4$ alkyl or alkoxy group are as exemplified in the description of formula (X2).

In formula (4), $X^4$ is a divalent group having the formula (X4).

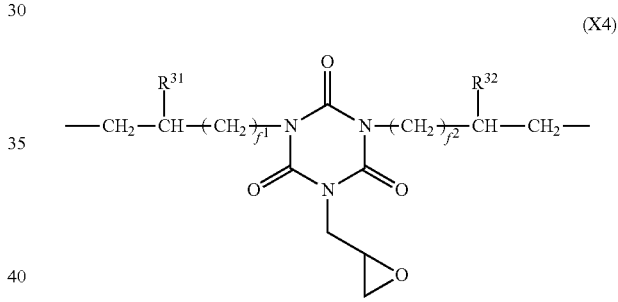

(X4)

In formula (X4), $R^{31}$ and $R^{32}$ are each independently hydrogen or methyl, and $f^1$ and $f^2$ are each independently an integer of 0 to 7.

In formulae (1) to (4), p, q, r and s indicative of contents (molar fractions) of repeating units (1), (2), (3), and (4) in Polymer A, respectively, are numbers in the range: $0<p<1$, $0\leq q<1$, $0\leq r<1$, $0\leq s<1$, $0<q+r+s<1$, and $p+q+r+s=1$. From the aspects of film formation or handling, p, q, r and s are preferably numbers in the range: $0.1\leq p\leq 0.9$, $0\leq q\leq 0.9$, $0\leq r\leq 0.9$, $0\leq s\leq 0.9$, and $0.1\leq q+r+s\leq 0.9$, more preferably $0.2\leq p\leq 0.8$, $0\leq q\leq 0.8$, $0\leq r\leq 0.8$, $0\leq s\leq 0.8$, and $0.2\leq q+r+s\leq 0.8$, with the proviso that $p+q+r+s=1$. The repeating units (1) to (4) may be arranged either randomly or blockwise.

Polymer A preferably has a weight average molecular weight (Mw) of 3,000 to 500,000, more preferably 5,000 to 200,000. Polymers with Mw in the range are fully soluble in most common organic solvents. It is noted throughout the disclosure that Mw is measured by gel permeation chromatography (GPC) versus polystyrene standards using tetrahydrofuran as the elute.

Polymer A may be composed of randomly or alternately arranged repeating units (1) to (4) or plural blocks each consisting of units of the same type.

Polymer A exerts a sufficient film-forming function in the photosensitive resin composition. A photosensitive resin coating obtained from the composition comprising Polymer A has improved adhesion to substrates, electronic parts, semiconductor devices and the like, a pattern forming ability, and crack resistance.

Preparation of Polymer A

Polymer A may be prepared by addition polymerization of a compound having the formula (5), a compound having the formula (X1'), and at least one compound selected from a compound having the formula (X2'), a compound having the formula (X3'), and a compound having the formula (X4'), all shown below, in the presence of a metal catalyst.

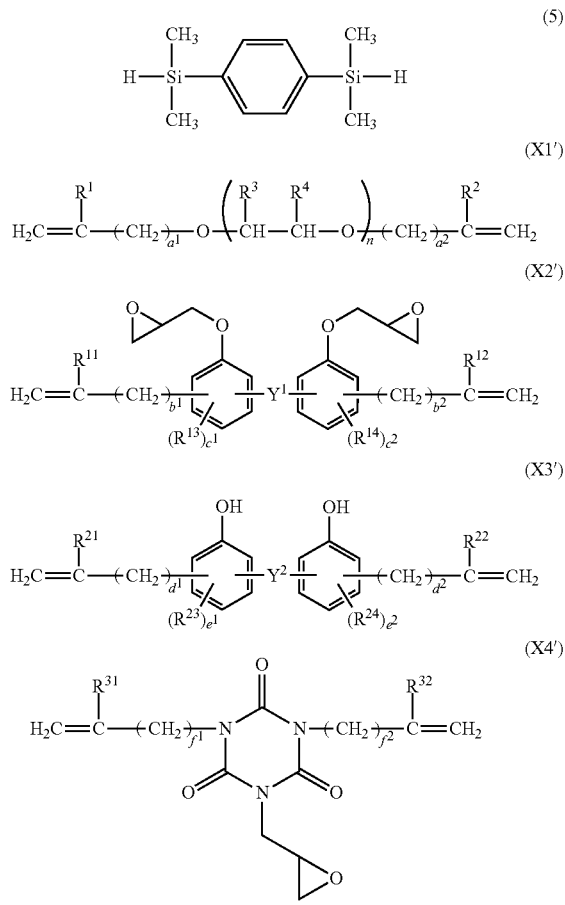

Herein $Y^1$, $Y^2$, $R^1$ to $R^4$, $R^{11}$ to $R^{14}$, $R^{21}$ to $R^{24}$, $R^{31}$, $R^{32}$, $a^1$, $a^2$, $b^1$, $b^2$, $c^1$, $c^2$, $d^1$, $d^2$, $e^1$, $e^2$, $f^1$, $f^2$ and n are as defined above.

Examples of the metal catalyst used herein include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. No. 3,159,601, 3,159,662 and 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight of platinum group metal based on the total weight of the reactants for polymerization reaction. In the polymerization reaction, a solvent may be used if desired. Suitable solvents are hydrocarbon solvents such as toluene and xylene. With respect to polymerization conditions, the polymerization temperature is preferably selected in a range of 40 to 150° C., more preferably 60 to 120° C., such that the catalyst may not be deactivated and the polymerization be completed within a short time. While the polymerization time varies with the type and amount of monomers, the polymerization reaction is preferably completed within about 0.5 to about 100 hours, more preferably about 0.5 to about 30 hours for preventing moisture entry into the polymerization system. After the completion of polymerization reaction, the solvent if any is distilled off, obtaining Polymer A.

The reaction procedure is not particularly limited. The preferred procedure is by first mixing a compound having formula (X1') with one or more compounds selected from a compound having formula (X2'), a compound having formula (X3'), and a compound having formula (X4'), heating the mixture, adding a metal catalyst to the mixture, and then adding a compound having formula (5) dropwise over 0.1 to 5 hours.

The reactants are preferably combined in such amounts that a molar ratio of hydrosilyl groups on the compound having formula (5) to the total of alkenyl groups on the compounds having formulae (X1'), (X2'), (X3'), and (X4') may range from 0.67/1 to 1.67/1, more preferably from 0.83/1 to 1.25/1. The Mw of Polymer A may be controlled using a molecular weight control agent such as a monoallyl compound (e.g., o-allylphenol), monohydrosilane (e.g., triethylhydrosilane) or monohydrosiloxane.

(B) Photoacid Generator

The photoacid generator (PAG) as component (B) is typically a compound which is decomposed to generate an acid upon exposure to light with a wavelength of 190 to 500 nm, the generated acid serving as a curing catalyst. Since the photosensitive resin composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

From the standpoint of photo-cure, the PAG (B) is preferably used in an amount of 0.05 to 20 parts by weight, and more preferably 0.05 to 5 parts by weight per 100 parts by weight of component (A). When the amount of the PAG is at least 0.05 part, it may generate a sufficient amount of acid for crosslinking reaction to proceed. As long as the amount of the PAG is up to 20 parts, any increase of the light absorption by the PAG itself is prevented and a lowering of transparency is avoided. The PAGs may be used alone or in admixture of two or more.

(C) Crosslinker

Preferably the photosensitive resin composition further comprises (C) a crosslinker. The crosslinker functions to facilitate pattern formation and to increase the strength of the cured composition.

Preferably, the crosslinker is selected from amino condensates modified with formaldehyde or formaldehyde-alcohol, nitrogen-containing compounds such as melamine, guanamine, glycoluril and urea compounds, having on the average at least two methylol and/or alkoxymethyl groups in the molecule, phenol compounds having on the average at least two methylol or alkoxymethyl groups in the molecule, and epoxy compounds having on the average at least two epoxy groups in the molecule. These compounds may be used alone or in admixture.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

Suitable melamine compounds include hexamethylolmelamine, hexamethoxymethylmelamine, trimethoxymethylmonomethylolmelamine, dimethoxymethylmonomethylolmelamine, trimethylolmelamine, and hexamethoxyethylmelamine. Suitable guanamine compounds include tetramethylolguanamine, tetramethoxymethylguanamine and tetramethoxyethylguanamine.

Suitable glycoluril compounds include tetramethylolglycoluril and tetramethoxymethylglycoluril. Suitable urea compounds include tetramethylolurea, tetramethoxymethylurea, and tetramethoxyethylurea.

Examples of the phenol compound having on the average at least two methylol or alkoxymethyl groups in a molecule include (2-hydroxy-5-methyl)-1,3-benzenedimethanol and 2,2',6,6'-tetramethoxymethylbisphenol A.

Examples of the epoxy compound having on the average at least two epoxy groups in a molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

The crosslinker (C) is preferably used in an amount of 0.5 to 50 parts, and even more preferably 1 to 30 parts by weight per 100 parts by weight of component (A). At least 0.5 part of component (C) ensures sufficient cure upon light exposure. As long as the amount of component (C) is up to 50 parts, the proportion of Polymer A in the resin composition is not reduced, allowing the cured composition to exert its effects to the full extent. The crosslinkers may be used alone or in admixture.

(D) Solvent

The photosensitive resin composition may further comprise a solvent as component (D). The solvent used herein is not particularly limited as long as the foregoing components (A) to (C), and component (E) and additives to be described later are soluble.

Preferred are organic solvents in which the foregoing components are fully soluble. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in admixture. Of these solvents, preferred are ethyl lactate, cyclohexanone, cyclopentanone, PGMEA, γ-butyrolactone, and mixtures thereof, in which the PAG is most soluble.

From the standpoints of compatibility and viscosity of the resin composition, the amount of the solvent (D) used is preferably 50 to 2,000 parts, more preferably 50 to 1,000 parts, and even more preferably 50 to 100 parts by weight per 100 parts by weight of components (A) and (B) combined.

(E) Quencher

The photosensitive resin composition may further contain a quencher as component (E). The quencher used herein is preferably a compound capable of suppressing the rate of diffusion when the acid generated by the PAG diffuses within the resin coating. The inclusion of the quencher improves resolution, suppresses changes in sensitivity following exposure and reduces substrate and environment dependence, as well as improving the exposure latitude and the pattern profile.

Examples of the quencher include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

From the standpoint of sensitivity, the amount of the quencher (E) is preferably 0 to 3 parts by weight, more preferably 0.01 to 1 part by weight per 100 parts by weight of component (A). The quenchers may be used alone or in admixture of two or more.

Other Additives

Besides the aforementioned components, the photosensitive resin composition may include optional additives. A typical additive is a surfactant which is commonly used for improving the coating characteristics.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093.

The surfactant is preferably used in an amount of 0.01 to 5 parts by weight, more preferably 0.1 to 3 parts by weight per 100 parts by weight of component (A). The surfactants may be used alone or in admixture.

Another useful additive is a silane coupling agent, which is effective for further increasing the adhesion of the resin composition to an adherend. Suitable silane coupling agents include epoxy-containing silane coupling agents and aromatic group-containing aminosilane coupling agents. The silane coupling agent may be used alone or in admixture. Although the amount of the silane coupling agent used is not particularly limited, it is preferably 0.01 to 5% by weight of the resin composition.

The photosensitive resin composition of the invention is prepared in any desired way. For example, it may be prepared by agitating and mixing the aforementioned components and optionally passing the mixture through a filter to remove solids.

From the photosensitive resin composition, a resin coating may be formed to a wide range of thickness. From the resin coating, a pattern having fine feature size and perpendicularity may be formed by the pattern forming process to be described below.

The photosensitive resin composition is advantageously used, for example, as a film-forming material for semiconductor device protective film, interconnection protective film, coverlay film, solder mask, and TSV dielectric film, an adhesive between substrates in three-dimensional laminates, and a resist material for plating.

Pattern Forming Process Using Photosensitive Resin Composition

Another embodiment of the invention is a pattern forming process comprising the steps of:
  (i) coating the photosensitive resin composition onto a substrate to form a photosensitive resin coating thereon,
  (ii) exposing the photosensitive resin coating to radiation to define exposed and unexposed regions, and
  (iii) developing the exposed resin coating in a developer to dissolve away the unexposed region of the resin coating and to form a pattern of the resin coating.

First, in step (i), the photosensitive resin composition is coated onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating.

The coating technique may be any well-known technique, for example, dipping, spin coating, roll coating or the like. The coating weight may be selected as appropriate for a particular purpose, preferably so as to form a photosensitive resin coating having a thickness of 1 to 400 μm, more preferably 5 to 200 μm.

A pre-wetting technique of dispensing a solvent dropwise on a substrate prior to coating of the resin composition may be employed for the purpose of making the coating thickness on the substrate more uniform. The type and amount of the solvent dispensed dropwise may be selected for a particular purpose. For example, alcohols such as isopropyl alcohol (IPA), ketones such as cyclohexanone, and glycols such as propylene glycol monomethyl ether are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation to define exposed and unexposed regions. The exposure radiation is generally of wavelength 1 to 600 nm, preferably 10 to 600 nm, more preferably 190 to 500 nm. Examples of radiation in the wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 mJ/cm$^2$.

Exposure may be made through a photomask. The photomask may be, for example, one perforated with a desired pattern. Although the material of the photomask is not particularly limited, a material capable of shielding radiation in the above wavelength range, typically chromium is preferred.

The next step may be post-exposure bake (PEB) which is effective for enhancing development sensitivity. PEB is preferably performed at 40 to 150° C. for 0.5 to 10 minutes. The exposed region of the resin coating is crosslinked by PEB to form an insolubilized pattern which is insoluble in a solvent as developer.

The exposure or PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as propylene glycol monomethyl ether. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. The post-cure is effective for increasing the crosslinking density of the resin coating and removing any residual volatile matter. The resulting coating has augmented adhesion to substrates, heat resistance, mechanical strength, good electric properties, bond strength, and reliability. A post-cure temperature in the range of 100 to 250° C. is preferred for acquiring the above properties. The resin coating as post-cured has a thickness of 1 to 400 μm, preferably 5 to 200 μm.

Although the pattern forming process has been described, it is sometimes unnecessary to form a pattern. When it is simply desired to form a uniform film, for example, the same process as above may be followed except that in step (ii), the resin coating is exposed to radiation of suitable wavelength directly, i.e., without the photomask.

Photosensitive Dry Film

A further embodiment of the invention is a photosensitive dry film comprising a support and the photosensitive resin coating of the photosensitive resin composition thereon.

The photosensitive dry film (support+photosensitive resin coating) is solid, and the photosensitive resin coating contains no solvent. This eliminates the risk that bubbles resulting from volatilization of solvent are left within the resin coating and between the resin coating and the rugged substrate surface. An appropriate thickness range exists for the resin coating when planarity and step coverage on rugged substrate surface and a substrate lamination spacing are taken into account. It is preferred from the standpoints of planarity, step coverage, and substrate lamination spacing that the photosensitive resin coating have a thickness of 5 to 500 μm, more preferably 20 to 350 μm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities on its surface, the photosensitive resin coating is coated so as to conform to the asperities, achieving high planarity. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support (film) is unwound from a supply roll in the film coater, passed across the head of the film coater where the photosensitive resin composition is coated onto the support to the predetermined buildup, and then moved through a hot air circulating oven at a predetermined temperature for a predetermined time, where the photosensitive resin coating is dried on the support. Thereafter, the support having the photosensitive resin coating thereon and a protective film which is unwound from another supply roll in the film coater are passed across a laminate roll under a predetermined pressure whereby the protective film is bonded to the photosensitive resin coating on the support, whereupon the laminate (protective film-bearing photosensitive dry film) is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38×1-A3, PET38×1-V8 and PET38×1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 µm, more preferably 25 to 50 µm, for consistent manufacture of photosensitive dry film, and prevention of wrapping or curling on a take-up roll.

Pattern Forming Process Using Photosensitive Dry Film

A further embodiment of the invention is a pattern forming process comprising the steps of:
(i') using the photosensitive dry film to form the photosensitive resin coating on a substrate,
(ii) exposing the photosensitive resin coating to radiation to define exposed and unexposed regions,
(iii) developing the exposed resin coating in a developer to dissolve away the unexposed region of the resin coating and to form a pattern of the resin coating.

In step (i'), the photosensitive dry film is used to form the photosensitive resin coating on a substrate. Specifically, the photosensitive dry film at its photosensitive resin coating is attached to a substrate to form the photosensitive resin coating on the substrate. When the photosensitive dry film is covered with the protective film, the dry film at its photosensitive resin coating is attached to a substrate after stripping the protective film therefrom, to form the photosensitive resin coating on the substrate. The dry film may be attached using a film attachment apparatus.

Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Also useful are substrates having grooves and/or holes having an opening width of 10 to 100 µm and a depth of 10 to 120 µm.

The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of 10 to 1,000 µm, preferably 100 to 500 µm is obtained.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour.

Like the pattern forming process using the photosensitive resin composition, the photosensitive resin coating attached to the substrate may be subjected to steps of (ii) exposing the photosensitive resin coating to radiation, (iii) developing the exposed resin coating in a developer to dissolve away the unexposed region of the resin coating and to form a pattern of the resin coating, and optionally (iv) post-curing the patterned coating. It is noted that the support of the photosensitive dry film may be removed before prebake or before PEB, by mechanical stripping or the like, depending on a particular process.

The resin coating obtained from the photosensitive resin composition or photosensitive dry film has excellent properties including flexibility, pattern forming ability, electric insulation, reliability as dielectric protective film, mechanical properties, and substrate adhesion. The resin coating is thus best suited as a protective film for electric and electronic parts such as semiconductor devices and as a resist material for plating.

EXAMPLES

Examples of the invention are given below by way of illustration and not by way of limitation. Notably, the weight average molecular weight (Mw) is measured by gel permeation chromatography (GPC) versus monodisperse polystyrene standards using GPC column TSKgel Super HZM-H (Tosoh Corp.) under analytical conditions: flow rate 0.6 mL/min, tetrahydrofuran elute, and column temperature 40° C. All parts are by weight (pbw).

The compounds used in polymer synthesis are shown below.

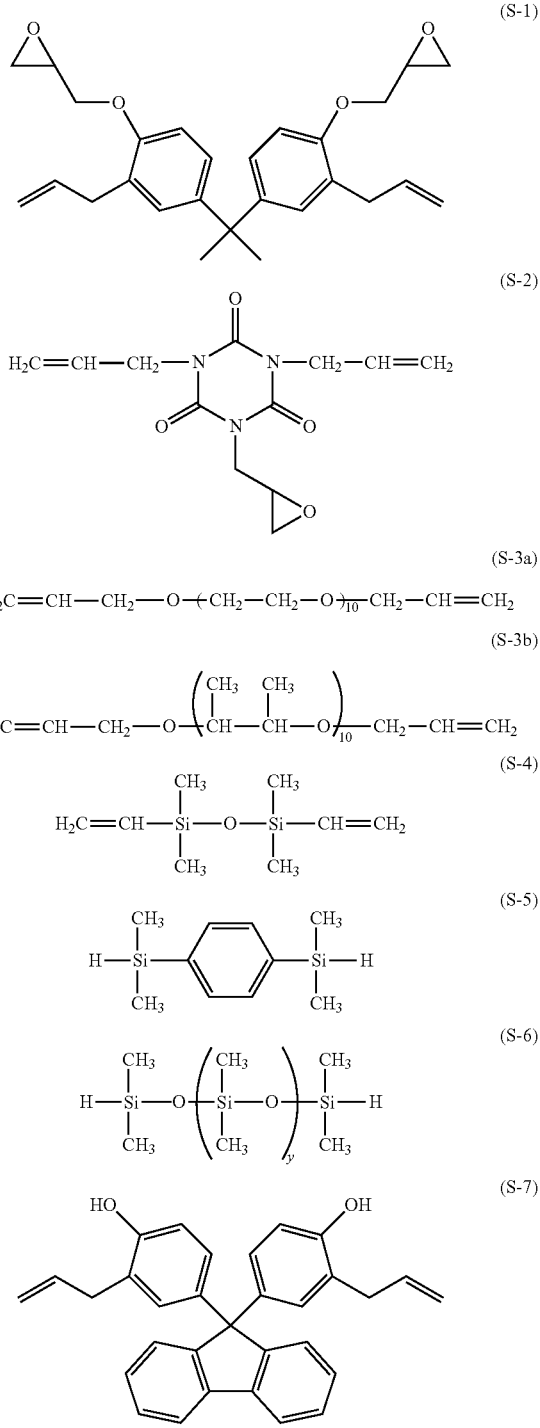

[1] Synthesis of Polymers

Example 1-1

Synthesis of Resin 1

A 3-L flask equipped with a stirrer, thermometer, nitrogen purge line and reflux condenser was charged with 156.8 g (0.40 mol) of the compound having formula (S-1), 53.9 g (0.10 mol) of the compound having formula (S-3a) (UNIOX from NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 1. Resin 1 had a Mw of 43,000. On $^1$H-NMR spectroscopy (Bruker Corp.), Resin 1 was identified to be a polymer containing repeating units (1) and (2).

Example 1-2

Synthesis of Resin 2

A 3-L flask equipped with a stirrer, thermometer, nitrogen purge line and reflux condenser was charged with 172.0 g (0.40 mol) of the compound having formula (S-7), 53.9 g (0.10 mol) of the compound having formula (S-3a), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 2. Resin 2 had a Mw of 25,000. On $^1$H-NMR spectroscopy (Bruker Corp.), Resin 2 was identified to be a polymer containing repeating units (1) and (3).

Example 1-3

Synthesis of Resin 3

A 3-L flask equipped with a stirrer, thermometer, nitrogen purge line and reflux condenser was charged with 106.0 g (0.40 mol) of the compound having formula (S-2), 53.9 g (0.10 mol) of the compound having formula (S-3a), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 3. Resin 3 had a Mw of 34,000. On $^1$H-NMR spectroscopy (Bruker Corp.), Resin 3 was identified to be a polymer containing repeating units (1) and (4).

Example 1-4

Synthesis of Resin 4

A 3-L flask equipped with a stirrer, thermometer, nitrogen purge line and reflux condenser was charged with 9.8 g (0.025 mol) of the compound having formula (S-1), 10.8 g (0.025 mol) of the compound having formula (S-7), 13.3 g (0.05 mol) of the compound having formula (S-2), and 215.6 g (0.40 mol) of the compound having formula (S-3a), and then with 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 4. Resin 4 had a Mw of 50,000. On $^1$H-NMR spectroscopy (Bruker Corp.), Resin 4 was identified to be a polymer containing repeating units (1), (2), (3), and (4).

Example 1-5

Synthesis of Resin 5

A 3-L flask equipped with a stirrer, thermometer, nitrogen purge line and reflux condenser was charged with 9.8 g (0.025 mol) of the compound having formula (S-1), 10.8 g (0.025 mol) of the compound having formula (S-7), 13.3 g (0.05 mol) of the compound having formula (S-2), and 327.2 g (0.40 mol) of the compound having formula (S-3b), and then with 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 5. Resin 5 had a Mw of 58,000. On $^1$H-NMR spectroscopy (Bruker Corp.), Resin 5 was identified to be a polymer containing repeating units (1), (2), (3), and (4).

Comparative Example 1-1

Synthesis of Resin 6

A 3-L flask equipped with a stirrer, thermometer, nitrogen purge line and reflux condenser was charged with 196.0 g (0.50 mol) of the compound having formula (S-1) and then 2,000 g of toluene and heated at 70° C. Thereafter, 1.0 g of a toluene solution of chloroplatinic acid (platinum concentration 0.5 wt %) was added, and 87.3 g (0.45 mol) of the compound having formula (S-5) and 79.3 g (0.05 mol) of the compound having formula (S-6) wherein y=20 were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 6. Resin 6 had a Mw of 41,000.

Comparative Example 1-2

Synthesis of Resin 7

A 3-L flask equipped with a stirrer, thermometer, nitrogen purge line and reflux condenser was charged with 215.0 g (0.50 mol) of the compound having formula (S-7) and then 2,000 g of toluene and heated at 70° C. Thereafter, 1.0 g of a toluene solution of chloroplatinic acid (platinum concentration 0.5 wt %) was added, and 48.5 g (0.25 mol) of the compound having formula (S-5) and 396.3 g (0.25 mol) of the compound having formula (S-6) wherein y=20 were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 7. Resin 7 had a Mw of 31,000.

Comparative Example 1-3

Synthesis of Resin 8

A 3-L flask equipped with a stirrer, thermometer, nitrogen purge line and reflux condenser was charged with 132.5 g (0.50 mol) of the compound having formula (S-2) and then 2,000 g of toluene and heated at 70° C. Thereafter, 1.0 g of a toluene solution of chloroplatinic acid (platinum concentration 0.5 wt %) was added, and 77.6 g (0.40 mol) of the compound having formula (S-5) and 158.5 g (0.10 mol) of the compound having formula (S-6) wherein y=20 were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 8. Resin 8 had a Mw of 44,000.

Comparative Example 1-4

Synthesis of Resin 9

A 3-L flask equipped with a stirrer, thermometer, nitrogen purge line and reflux condenser was charged with 9.8 g (0.025 mol) of the compound having formula (S-1), 10.8 g (0.025 mol) of the compound having formula (S-7), 13.3 g (0.05 mol) of the compound having formula (S-2) and 74.4 g (0.40 mol) of the compound having formula (S-4) and then with 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 9. Resin 9 had a Mw of 39,000.

Comparative Example 1-5

Synthesis of Resin 10

A 3-L flask equipped with a stirrer, thermometer, nitrogen purge line and reflux condenser was charged with 78.4 g (0.20 mol) of the compound having formula (S-1), 43.0 g (0.10 mol) of the compound having formula (S-7), and 53.0 g (0.20 mol) of the compound having formula (S-2) and then with 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 10. Resin 10 had a Mw of 29,000.

[2] Preparation and Evaluation of Photosensitive Resin Composition

Examples 2-1 to 2-11 and Comparative Examples 2-1 to 2-10

Photosensitive resin compositions of Examples 2-1 to 2-11 and Comparative Examples 2-1 to 2-10 were prepared by combining the resin (Resins 1 to 10), photoacid generator, crosslinker, solvent, and quencher in accordance with the formulation shown in Tables 1 and 2, agitating them at room temperature until dissolution, and precision filtering through a Teflon® filter with a pore size of 1.0 µm.

TABLE 1

| Component | | Example | | | | | | | | | | |
|---|---|---|---|---|---|---|---|---|---|---|---|---|
| (pbw) | | 2-1 | 2-2 | 2-3 | 2-4 | 2-5 | 2-6 | 2-7 | 2-8 | 2-9 | 2-10 | 2-11 |
| (A) Resin | Resin 1 | 100 | | | | 100 | | | | | | |
| | Resin 2 | | 100 | | | | | | | | | |
| | Resin 3 | | | 100 | | | 100 | | | | | |
| | Resin 4 | | | | 100 | | | 100 | 100 | 100 | | |
| | Resin 5 | | | | | | | | | | 100 | 100 |
| (B) Photoacid generator | PAG-1 | 1 | 1 | 1 | 1 | 1 | 1 | 1 | 5 | 1 | 1 | 1 |
| (C) Crosslinker | CL-1 | | 10 | | | | | | 10 | 10 | 10 | |
| | CL-2 | 10 | | 10 | 10 | | | | | | | 10 |
| (D) Solvent | cyclopentanone | 55 | 55 | 55 | 55 | 55 | 55 | 55 | 55 | 55 | 55 | 55 |
| (E) Quencher | AM-1 | | | | | | | | | 0.2 | | |

TABLE 2

| Component | | Comparative Example | | | | | | | | | |
|---|---|---|---|---|---|---|---|---|---|---|---|
| (pbw) | | 2-1 | 2-2 | 2-3 | 2-4 | 2-5 | 2-6 | 2-7 | 2-8 | 2-9 | 2-10 |
| (A) Resin | Resin 6 | 100 | | | | | | | | | |
| | Resin 7 | | 100 | | | | | | | | |
| | Resin 8 | | | 100 | | 100 | | | | | |
| | Resin 9 | | | | 100 | | 100 | | 100 | 100 | |
| | Resin 10 | | | | | | 100 | | 100 | | 100 |
| (B) Photoacid generator | PAG-1 | 1 | 1 | 1 | 1 | 1 | 1 | 1 | 1 | 5 | 1 |
| (C) Crosslinker | CL-1 | | 10 | | | | | | | | |
| | CL-2 | 10 | | 10 | 10 | 10 | | | | | |
| (D) Solvent | cyclopentanone | 55 | 55 | 55 | 55 | 55 | 55 | 55 | 55 | 55 | 55 |
| (E) Quencher | AM-1 | | | | | | | | | | 0.2 |

In Tables 1 and 2, photoacid generator PAG-1, crosslinkers CL-1 and CL-2, and quencher AM-1 are identified below.

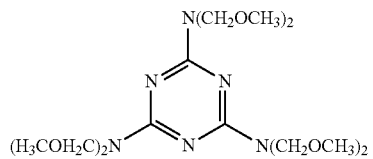

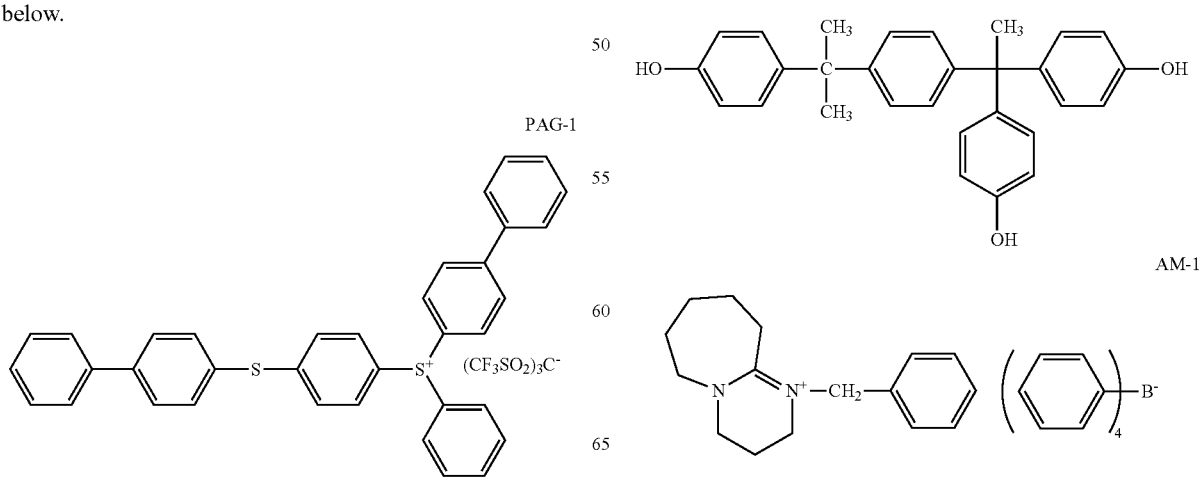

(1) Pattern Formation and Evaluation

A die coater was used as the film coater and a polyethylene terephthalate (PET) film of 38 μm thick used as the support. Each of the photosensitive resin compositions of Examples 2-1 to 2-11 and Comparative Examples 2-1 to 2-10 was coated onto the support. The coated support was passed through a hot air circulating oven (length 4 m) set at 100° C. over 5 minutes for drying to form a photosensitive resin coating on the support, yielding a photosensitive dry film. Using a laminating roll, a polyethylene film of 50 μm thick as the protective film was bonded to the photosensitive resin coating under a pressure of 1 MPa, yielding a protective film-bearing photosensitive dry film. The thickness of each to photosensitive resin coating is tabulated in Tables 3 and 4. The thickness of a resin coating was measured by an optical interference film thickness gauge.

From the protective film-bearing photosensitive dry film, the protective film was stripped off. Using a vacuum laminator TEAM-100RF (Takatori Corp.) with a vacuum chamber set at a vacuum of 80 Pa, the photosensitive resin coating on the support was closely bonded to a silicon substrate having copper sputter deposited on its surface to a thickness of 400 nm. The temperature was 110° C. After restoration of atmospheric pressure, the substrate was taken out of the laminator, and the support was stripped off. Then the photosensitive resin coating was prebaked on a hot plate at 130° C. for 5 minutes for enhancing adhesion to the substrate.

Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in propylene glycol monomethyl ether acetate (PGMEA) for 300 seconds for forming a pattern of the resin coating.

The patterned photosensitive resin coating on the substrate was post-cured in an oven at 180° C. for 2 hours while the oven was purged with nitrogen. Under a scanning electron microscope (SEM), the contact hole patterns of 300 μm, 200 μm, 100 μm, 80 μm, and 60 μm were observed in cross section, with the minimum hole pattern in which holes extended down to the film bottom being reported as maximum resolution. From the cross-sectional photo, the contact hole pattern of 80 μm was evaluated for perpendicularity, and rated "Excellent (Exc.)" for perpendicular pattern, "Good" for slightly inversely tapered profile, "Fair" for inversely tapered profile, and "Poor" for opening failure.

(2) Evaluation of Electric Properties (Dielectric Breakdown Strength)

For the evaluation of dielectric breakdown strength of a photosensitive resin coating of a photosensitive resin composition, each of the photosensitive resin compositions of Examples 2-1 to 2-11 and Comparative Examples 2-1 to 2-10 was coated onto a steel plate of 13 cm×15 cm×0.7 mm (thick) by means of a bar coater and heated in an oven at 180° C. for 2 hours to form a photosensitive resin coating. The resin composition was coated such that the resulting coating had a thickness of 0.2 μm. The resin coating was tested by a breakdown tester TM-5031AM (Tama Densoku Co., Ltd.) to determine the dielectric breakdown strength thereof.

(3) Evaluation of Reliability (Adhesion, Crack Resistance)

Each of the photosensitive resin coating-bearing substrates after pattern formation and post-cure in Test (1) was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed whether or not the resin coating peeled from the substrate and whether or not the resin coating cracked. The sample was rated "Good" when all specimens did not peel or crack, "Peeled" when one or more specimens peeled, and "Cracked" when one or more specimens cracked.

The results are shown in Tables 3 and 4.

TABLE 3

| | | Example | | | | | | | | | | |
|---|---|---|---|---|---|---|---|---|---|---|---|---|
| | | 2-1 | 2-2 | 2-3 | 2-4 | 2-5 | 2-6 | 2-7 | 2-8 | 2-9 | 2-10 | 2-11 |
| Resin coating thickness (μm) | | 302 | 305 | 298 | 297 | 303 | 301 | 299 | 301 | 300 | 302 | 305 |
| Contact hole pattern profile | | Exc. | Exc. | Exc. | Exc. | Good | Good | Good | Good | Exc. | Exc. | Exc. |
| Maximum resolution (μm) | | 60 | 60 | 60 | 60 | 80 | 80 | 80 | 100 | 60 | 60 | 60 |
| Dielectric breakdown strength (V/μm) | | 815 | 810 | 800 | 810 | 700 | 715 | 720 | 720 | 805 | 820 | 815 |
| Reliability | Peeled or not | Good | Good | Good | Good | Good | Good | Good | Good | Good | Good | Good |
| | Cracked or not | Good | Good | Good | Good | Good | Good | Good | Good | Good | Good | Good |

TABLE 4

| | | Comparative Example | | | | | | | | | |
|---|---|---|---|---|---|---|---|---|---|---|---|
| | | 2-1 | 2-2 | 2-3 | 2-4 | 2-5 | 2-6 | 2-7 | 2-8 | 2-9 | 2-10 |
| Resin coating thickness (μm) | | 298 | 302 | 303 | 299 | 303 | 301 | 304 | 299 | 298 | 300 |
| Contact hole pattern profile | | Fair | Fair | Fair | Fair | Fair | Fair | Fair | Fair | Fair | Fair |
| Maximum resolution (μm) | | 300 | 300 | 300 | 300 | 300 | 300 | 300 | 300 | 300 | 300 |
| Dielectric breakdown strength (V/μm) | | 490 | 520 | 510 | 515 | 530 | 495 | 500 | 520 | 525 | 540 |
| Reliability | Peeled or not | Peeled | Peeled | Peeled | Peeled | Peeled | Peeled | Peeled | Peeled | Peeled | Peeled |
| | Cracked or not | Cracked | Cracked | Cracked | Cracked | Cracked | Cracked | Cracked | Cracked | Cracked | Cracked |

As is evident from the test results, the photosensitive resin compositions of Examples 2-1 to 2-11 within the scope of the invention experience little film thickness loss, exhibit good resolution, i.e., sufficient properties as photosensitive material. The cured resin coatings obtained therefrom have improved electric properties (e.g., dielectric breakdown strength), and improved adhesion and crack resistance after the thermal cycling test, and are thus useful as protective film for circuits and electronic parts. Thus photosensitive dry films having more reliability are available.

(4) Evaluation as Resist Material for Plating

The photosensitive resin compositions of Examples 2-1 to 2-11 were examined for their performance as a resist material for plating.

From the protective film-bearing photosensitive dry film prepared by the same procedure as in (1), the protective film was stripped off. Using a vacuum laminator TEAM-100RF (Takatori Corp.) with a vacuum chamber set at a vacuum of 80 Pa, the photosensitive resin coating on the support was closely bonded to a silicon substrate having copper sputter deposited on its surface to a thickness of 400 nm. The temperature was 110° C. After restoration of atmospheric pressure, the substrate was taken out of the laminator, and the support was stripped off. Then the photosensitive resin coating was prebaked on a hot plate at 130° C. for 5 minutes for enhancing adhesion to the substrate.

Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in PGMEA for 300 seconds for forming a pattern of the resin coating. The pattern-bearing substrate was immersed in a copper plating bath (Microfab Cu200, Electroplating Engineers of Japan Ltd.), where electroplating of copper was carried out at a constant current flow. In Examples 2-1 to 2-11, Cu-plating posts were properly formed, without stripping of the resin coating. It is demonstrated that the photosensitive resin compositions are also useful as a resist material for plating.

Japanese Patent Application No. 2018-095370 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) a silphenylene and polyether structure-containing polymer comprising repeating units having the following formula (1) and optionally having the following formulae (2) to (4), and (B) a photoacid generator,

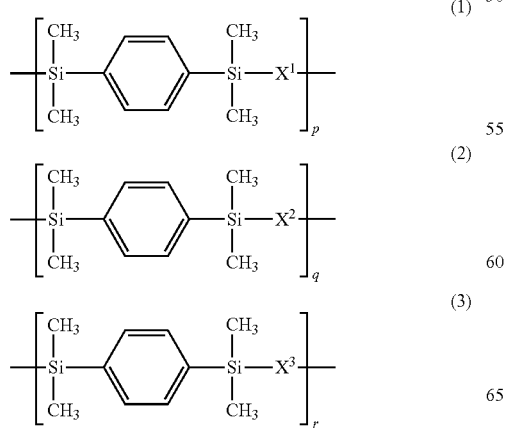

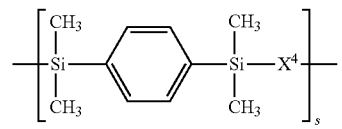

wherein $X^1$ is a divalent group having the following formula (X1), $X^2$ is a divalent group having the following formula (X2), $X^3$ is a divalent group having the following formula (X3), $X^4$ is a divalent group having the following formula (X4), and p, q, r and s are numbers in the range: $0<p<1$, $0\leq q\leq 1$, $0\leq r<1$, $0\leq s<1$, $0<q+r+s<1$, and $p+q+r+s=1$,

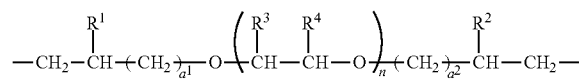

wherein $R^1$ and $R^2$ are each independently hydrogen or a $C_1$-$C_8$ monovalent hydrocarbon group, $R^3$ and $R^4$ are each independently hydrogen or methyl, $a^1$ and $a^2$ are each independently an integer of 1 to 6, and n is an integer of 0 to 100,

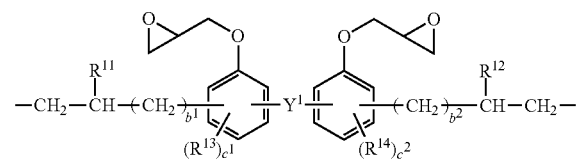

wherein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $b^1$ and $b^2$ are each independently an integer of 0 to 7, and $c^1$ and $c^2$ are each independently an integer of 0 to 2,

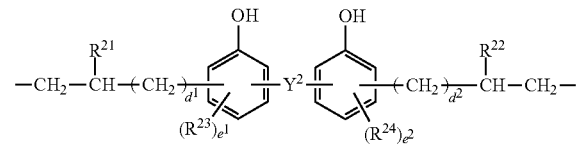

wherein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $d^1$ and $d^2$ are each independently an integer of 0 to 7, and $e^1$ and $e^2$ are each independently an integer of 0 to 2,

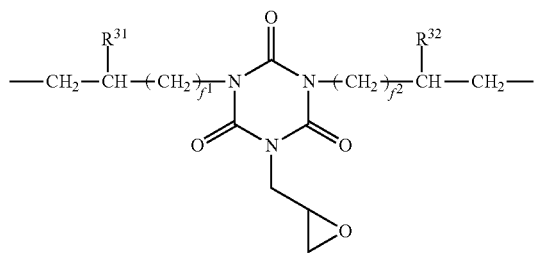

(X4)

wherein $R^{31}$ and $R^{32}$ are each independently hydrogen or methyl, and $f^1$ and $f^2$ are each independently an integer of 0 to 7.

2. The photosensitive resin composition of claim 1, further comprising (C) a crosslinker.

3. The photosensitive resin composition of claim 2 wherein the crosslinker is at least one compound selected from the group consisting of an amino condensate modified with formaldehyde or formaldehyde-alcohol, a phenol compound having on the average at least two methylol or alkoxymethyl groups in the molecule, and an epoxy compound having on the average at least two epoxy groups in the molecule.

4. The photosensitive resin composition of claim 1, further comprising (D) a solvent.

5. The photosensitive resin composition of claim 1, further comprising (E) a quencher.

6. A photosensitive resin coating obtained from the photosensitive resin composition of claim 1.

7. A photosensitive dry film comprising a support and the photosensitive resin coating of claim 6 thereon.

8. A pattern forming process comprising the steps of:
(i') applying the photosensitive dry film of claim 7 onto a substrate by attaching the photosensitive coating to the substrate,
(ii) exposing the photosensitive resin coating to radiation to define exposed and unexposed regions, and
(iii) developing the exposed resin coating in a developer to dissolve away the unexposed region of the resin coating and to form a pattern of the resin coating.

9. A pattern forming process comprising the steps of:
(i) coating the photosensitive resin composition of claim 1 onto a substrate to form a photosensitive resin coating thereon,
(ii) exposing the photosensitive resin coating to radiation to define exposed and unexposed regions, and
(iii) developing the exposed resin coating in a developer to dissolve away the unexposed region of the resin coating and to form a pattern of the resin coating.

10. The pattern forming process of claim 9, further comprising (iv) post-curing the patterned resin coating resulting from development step (iii) at a temperature of 100 to 250° C.

11. The photosensitive resin composition of claim 1 which is to form a coating for protecting electric and electronic parts.

12. The photosensitive resin composition of claim 1 which is used as a resist material in the step of forming copper interconnects by plating.

\* \* \* \* \*